United States Patent [19]
Kawaji et al.

[11] Patent Number: 5,141,888
[45] Date of Patent: Aug. 25, 1992

[54] PROCESS OF MANUFACTURING SEMICONDUCTOR INTEGRATED CIRCUIT DEVICE HAVING TRENCH AND FIELD ISOLATION REGIONS

[75] Inventors: Mikinori Kawaji, Hino; Toshihiko Takakura; Akihisa Uchida, both of Koganei; Shigeo Kuroda, Ome; Yoichi Tamaki, Kokubunji; Takeo Shiba, Kodaira; Kazuhiko Sagara, Tokyo; Masao Kawamura, Fuchu, all of Japan

[73] Assignee: Hitachi, Ltd., Tokyo, Japan

[21] Appl. No.: 642,922

[22] Filed: Jan. 18, 1991

Related U.S. Application Data

[60] Division of Ser. No. 284,557, Dec. 15, 1988, Pat. No. 5,011,788, which is a division of Ser. No. 11,932, Feb. 16, 1987, Pat. No. 4,819,054, which is a continuation-in-part of Ser. No. 824,929, Jan. 31, 1986, abandoned, which is a continuation of Ser. No. 536,519, Sep. 28, 1983, abandoned, which is a continuation-in-part of Ser. No. 670,976, Nov. 13, 1984, abandoned.

[30] Foreign Application Priority Data

Sep. 29, 1982 [JP] Japan ................. 57-168355
Nov. 11, 1983 [JP] Japan ................. 58-210834

[51] Int. Cl.⁵ ............................................. H01L 21/70
[52] U.S. Cl. ............................ 437/33; 437/38; 437/67; 437/69; 437/70; 148/DIG. 50
[58] Field of Search ............... 437/31, 38, 67, 68, 437/228, 33; 148/DIG. 50

[56] References Cited

U.S. PATENT DOCUMENTS

| | | | |
|---|---|---|---|
| 4,396,460 | 8/1983 | Tamaki et al. | 156/653 |
| 4,470,062 | 9/1984 | Muramatsu | 357/50 |
| 4,509,249 | 4/1985 | Goho et al. | 437/67 |

FOREIGN PATENT DOCUMENTS

| | | | |
|---|---|---|---|
| 0038831 | 2/1985 | Japan . | |
| 0092632 | 5/1985 | Japan | 437/67 |
| 0136327 | 7/1985 | Japan . | |
| 0226136 | 11/1985 | Japan . | |
| 0232623 | 10/1986 | Japan . | |
| 0249448 | 10/1987 | Japan . | |

*Primary Examiner*—Tom Thomas
*Attorney, Agent, or Firm*—Antonelli, Terry, Stout & Kraus

[57] ABSTRACT

A bipolar type of semiconductor integrated circuit device is provided with U-shaped grooves which are formed by cutting a main surface of a semiconductor body to form isolation regions between bipolar transistors. A silicon oxide film can be formed in the U-shaped grooves by thermal oxidation simultaneously with the formation of a silicon oxide film used to form isolation regions between each collector contact region and base region. No separate step is needed for forming the silicon oxide film between the collector contact region and the base region. The thickness of the silicon oxide film can be controlled, and has a sufficient thickness even at its two edges, i.e., at its boundaries with the U-shaped grooves, so that the bipolar transistors exhibit good electrical characteristics. Namely, the collector resistance thereof does not increase, and the breakdown voltage at the pn junction between the collector region and the base region does not decrease. The U-shaped grooves can each comprise narrow and deep sub-grooves, with thick oxide films formed on the surfaces of the sub-grooves and a thick oxide film formed on a surface of an area between the sub-grooves, and with wiring formed on the oxide on the area between the sub-grooves.

37 Claims, 12 Drawing Sheets

PROCESS OF MANUFACTURING SEMICONDUCTOR INTEGRATED CIRCUIT DEVICE HAVING TRENCH AND FIELD ISOLATION REGIONS

This application is a divisional application of application Ser. No. 07/284,557, filed Dec. 15, 1988, now U.S. Pat. No. 5,011,788, which is a divisional application of application Ser. No. 011,932, filed Feb. 6, 1987, now U.S. Pat. No. 4,819,054, which is a continuation-in-part application of application Ser. No. 824,929, filed Jan. 31, 1986, now abandoned (which is a continuation application of application Ser. No. 536,519, filed Sep. 28, 1983) now abandoned and which is also a continuation-in-part application of application Ser. No. 670,976, filed Nov. 13, 1984 now abandoned.

BACKGROUND OF THE INVENTION

The present invention relates to a semiconductor device and semiconductor fabrication techniques. More particularly, the present invention relates to a semiconductor device in which a plurality of semiconductor elements and/or regions are electrically isolated from each other by grooves formed in a semiconductor substrate, and to a technique of isolating elements which can be effectively utilized for the formation of element-isolating regions in a semiconductor integrated circuit device.

Elements in semiconductor integrated circuit devices are isolated by a pn junction isolation method using diffusion layers or by an oxidation film isolation method utilizing local oxidation films formed over the surface of the substrate. With these isolation methods, however, the widths of the isolation regions are relatively wide. As the size of the elements becomes smaller, therefore, the isolation regions occupy proportionally larger areas. This makes it difficult to obtain LSI (large-scale integrated) circuits in a very densely integrated form. The applicants have therefore proposed an isolation technique called the U-groove isolation method in which portions that act as isolation regions between active regions of elements are cut to form U-shaped grooves (moats or trenches, hereinafter referred to as U-grooves). A silicon dioxide film is formed within the U-grooves which are then filled with polycrystalline silicon. These form element-isolating regions.

This technique has been disclosed in, for example, the journal "NIKKEI ELECTRONICS", Mar. 29, 1982, No. 287, pp. 90-101.

Such isolation method of isolating semiconductor devices by forming grooves in a semiconductor substrate and filling the grooves with insulative material requires a smaller space and attains a smaller parasitic capacitance than a pn junction isolation method and it is suitable to a high integration and high speed LSI. However, in this method, if the grooves on the surface after the insulating material has been filled in the grooves are wide, it is difficult to flatten the surface and a very complex process is required to flatten the surface. Accordingly, the width of the grooves is restricted to facilitate the flattening. However, when the width of the isolation grooves is restricted, parasitic active regions are created in the devices on the opposite sides of the groove and wiring capacitance increases. This results in a reduction of operation speed of the circuit.

The fact that a propagation delay time of 0.3 ns/gate with an isolation capacitance of 0.2 pF is attained by forming grooves in a semiconductor integrated circuit substrate is disclosed in an article Japanese Journal of Applied Physics, Volume 21 (1982) Supplemental 21-1, pages 37-40.

U.S. Pat. No. 4,396,460, directed to subject matter invented by the authors of the above article and filed on May 21, 1982, discloses a method for flattening an area of a wide isolation groove.

Bipolar transistors are the main elements in the construction of a bipolar type of semiconductor integrated circuit device. However, bipolar transistors must be isolated from each other by U-grooves when they are very densely arranged on a semiconductor substrate.

To reduce the size of a bipolar transistor, however, an $n^+$-type semiconductor region that acts as a collector contact region must be isolated by an insulating material from a $p^+$-type base region.

SUMMARY OF THE INVENTION

It is an object of the present invention to provide a semiconductor device which can reduce a stray capacity of wiring on an inactive region without complicating the manufacturing process.

The isolation in accordance with the present invention uses a combination of a pair of narrow and deep grooves, oxide films (e.g., thick oxide films) on the surfaces of the grooves, and an oxide film (e.g., thick oxide film) on a surface area between the grooves.

As another aspect of the present invention, the inventors have discovered that a problem arises when an attempt is made to simultaneously satisfy the two requirements of providing bipolar transistors isolated from each other by U-grooves and providing an $n^+$-type semiconductor region acting as a contact region and a $p^+$-type base region isolated from each other by an insulating material.

When deep U-grooves isolating individual transistors and shallow U-grooves isolating each base region and collector region are used, the manufacturing process is complicated, and increased collector resistance makes the switching speed drop.

When U-grooves are used to isolate individual transistors, and when a field oxide film is used to isolate each base region and collector region, the breakdown voltage at the pn junction between the base region and the collector region drops due to "bird's beaks" formed in the field oxide film.

Accordingly, an object of this aspect of the present invention is to increase the degree of integration of semiconductor integrated circuit devices (e.g., bipolar semiconductor integrated circuit devices), without impairing their electrical characteristics.

A further object is to improve the electrical characteristics of semiconductor elements formed on a semiconductor body.

A further object is to provide a process of manufacturing a semiconductor integrated circuit device in which semiconductor regions are sufficiently isolated from each other, without increasing the number of processing steps.

A further object is to provide a process of manufacturing a semiconductor substrate, for use in forming integrated circuit devices having increased integration with no impairment of electrical characteristics, and the substrate and integrated circuit device formed thereby.

This aspect of the present invention is described below briefly.

In a bipolar type of semiconductor integrated circuit device in which elements are isolated by U-groove isolation regions, an oxide film providing isolation is formed between a semiconductor region that acts as a collector contact region and a base region, simultaneously with the formation of a silicon oxide film within the U-shaped isolation grooves. This eliminates the necessity of providing a step of forming a new isolation oxide film. The thus-formed isolation oxide film does not reach the n+-type buried layer, and possesses sufficiently thick end portions even at its boundaries with the U-groove isolation regions.

DESCRIPTION OF THE PREFERRED EMBODIMENTS

A first embodiment concerning the manufacture of a bipolar integrated circuit is now explained.

Figure 1:
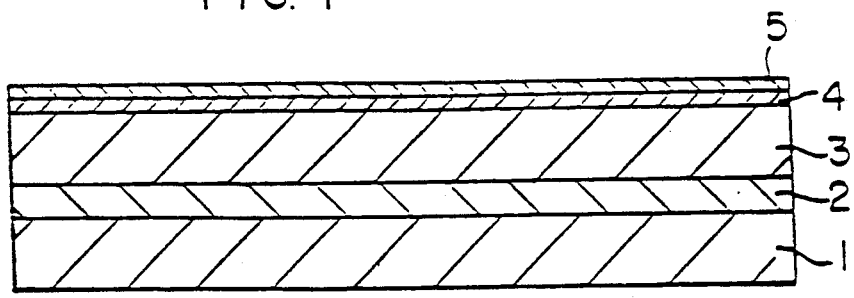
FIGS. 1 to 8 show manufacturing steps of one embodiment of the present invention.

As shown in FIG. 1, a collector buried layer 2 of a thickness of 0.5-3 $\mu$m is formed in a surface of a Si substrate 1 having a plane orientation (100), a Si epitaxial layer 3 (having a thickness of 0.5-3 $\mu$m, preferably 1-1.5 $\mu$m) which serves as an active region of a transistor is formed thereon, the surface thereof is oxidized to form a $SiO_2$ film 4 having a thickness of 0.05-0.10 $\mu$m, and a $Si_3N_4$ film is formed thereon by a well-known CVD process.

Figure 2:
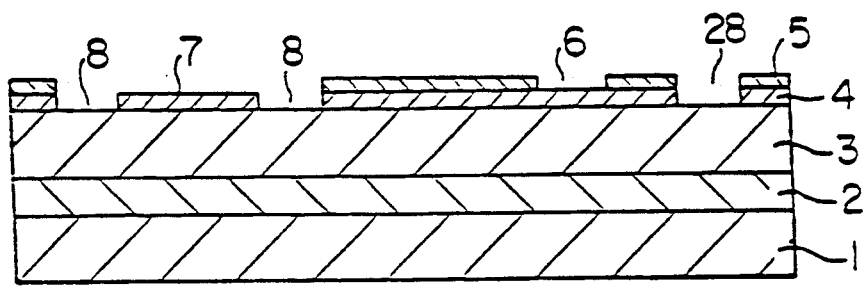

Then, the $Si_3N_4$ film 5 at areas 6, 7, 8 and 28 in which grooves are to be formed as shown in FIG. 2 are selectively removed by a dry-etching process using a conventional photo-etching method, and the surface is again photo-etched to remove the exposed areas 8 and 28 of the $SiO_2$ film 4 while leaving the $SiO_2$ film 4 at an area of a shallow isolation groove 6 and at a center area 7 of a wide isolation area 8-7-8 having a width of 0.5 to 2000 $\mu$m to form openings 8 and 28 at areas in which deep device isolation grooves are to be formed. The widths of the openings 6, 8 and 28 are preferably equal to or narrower than the depths of the grooves to be described later, from a standpoint of a subsequent flattening process.

Figure 3:
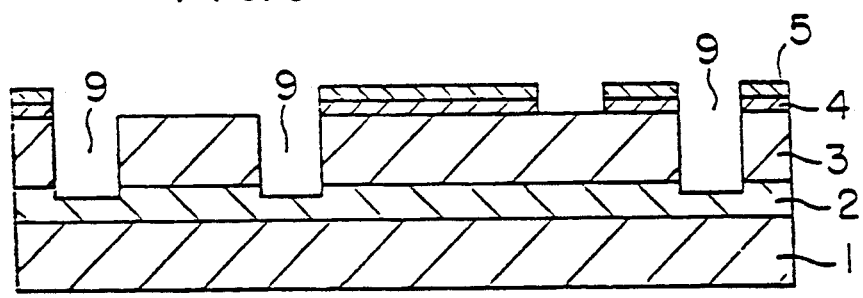

Then, as shown in FIG. 3, generally vertical grooves 9 are formed in the Si layer 3 by a well-known dry etching process such as a reactive sputter etching using the $SiO_2$ film 4 of the areas 6 and 7 as a mask. Before dry etching, the $SiO_2$ film 4 may be etched to widen the openings 6, 8 and 28 to diverge the tops of the grooves upward to enhance the flatness of the surface. This shape is hereinafter referred to as a Y-shaped groove. The flatness of this Y-shaped groove is advantageous to a multi-layered integrated circuit structure having an element or wiring stacked on the other element. The groove 9 extends through the Si epitaxial layer 3 and into the collector buried layer 2 by approximately 0.5 $\mu$m.

The exposed areas of the $SiO_2$ films 4 and 6 between the grooves 9 are removed by a wet etching process using buffered HF as an etchant (FIG. 3).

Figure 4:
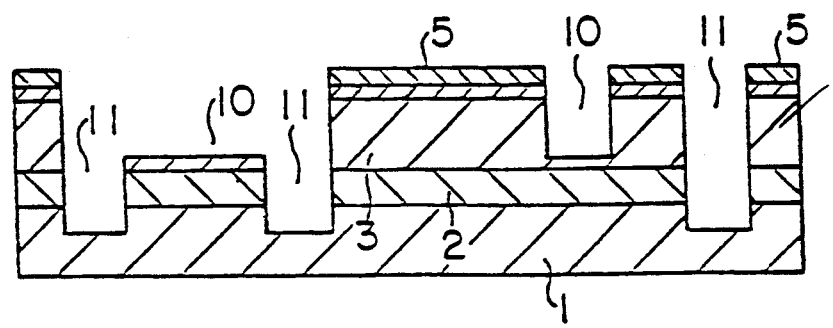

Then, the Si films 3, 2 and 1 are again dry-etched to form isolation grooves 10 which are shallower than the collector buried layer 2 and deep device-to-device isolation grooves 11 which extend into the collector buried layer 2 (FIG. 4). The depth of the grooves 11 is 1.5-6.5 $\mu$m depending on the thicknesses of the collector buried layer 2 and the Si epitaxial layer 3.

Figure 5:
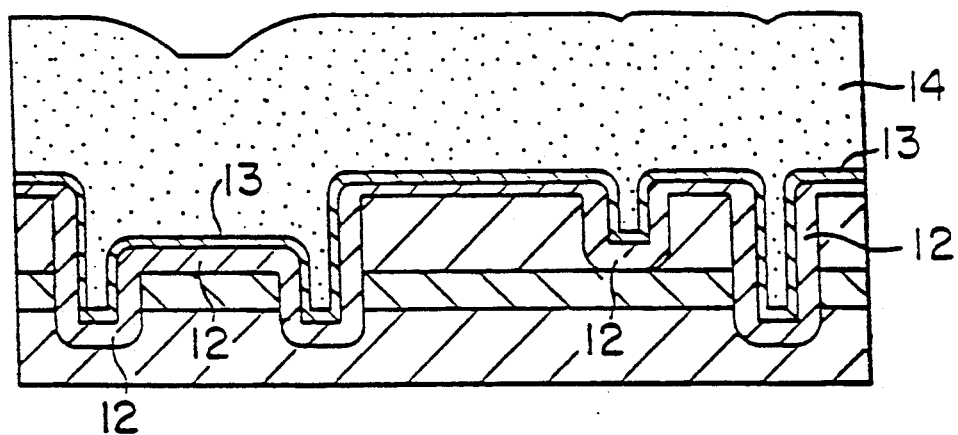

The exposed areas of the Si films 1, 2 and 3 are then oxidized using the $Si_3N_4$ film 5 as a mask to form a $SiO_2$ film 12 having a thickness of approximately 400 nm. After the $Si_3N_4$ film 5 used as the mask has been removed, a $Si_3N_4$ film 13 having a thickness of approximately 100 nm is formed on an entire surface, and a thick poly-Si layer 14 is formed by CVD process to fill the grooves (FIG. 5).

Figure 6:
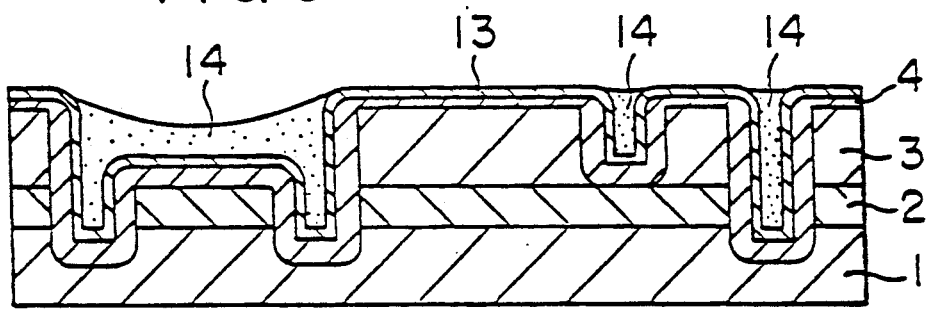

The poly-Si 14 is then etched by isotropic etching (either dry or wet) until the surface of the $Si_3N_4$ film 13 is exposed to flatten the surface (FIG. 6).

Then, the surface of the poly-Si 14 is oxidized to form a $SiO_2$ film 15 having a thickness of approximately 400 nm and the exposed areas of the $Si_3N_4$ film 13 are removed and a $Si_3N_4$ film 16 having a thickness of approximately 100 nm is formed on the entire surface. Thus, the interdevice and device-to-device isolation processes are completed (FIG. 7).

Figure 7:
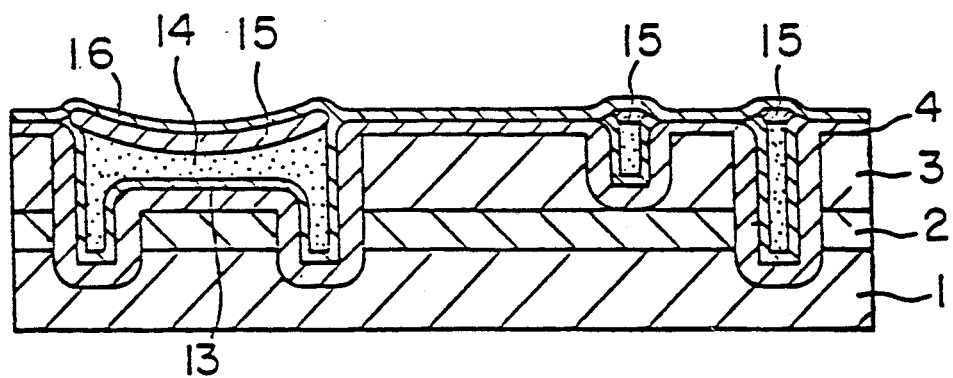
Figure 8:
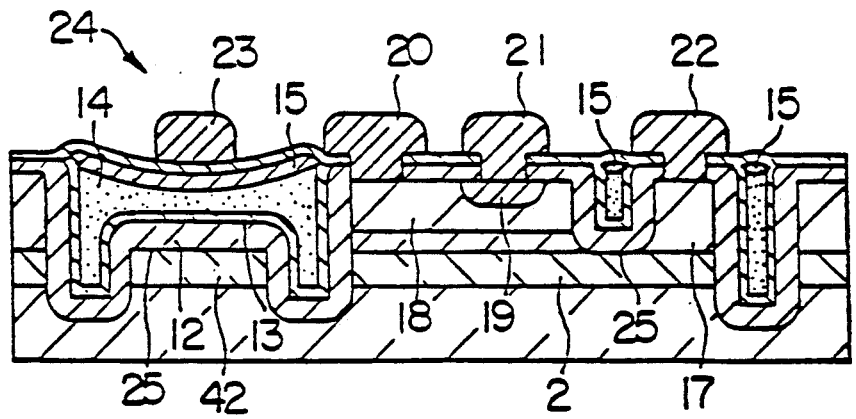

Then, a collector take-out region 17, a base region 18 and an emitter region 19 are formed by diffusion or ion implantation, and passivation film 16 formed in the step of FIG. 7 and the $SiO_2$ film 4 are selectively etched using a mask to form a base electrode 20, an emitter electrode 21 and a collector electrode 22 to complete a transistor (FIG. 8). A conductive line 23 deposited above the filling poly-Si layer is also shown in FIG. 8.

The bipolar LSI thus constructed has two thick oxide layers 12 and 15 and two $Si_3N_4$ layers 13 and 16 in the interdevice isolation area 24. Let us consider a parasitic capacitance between the conductive line 23 and the substrate 1. The dielectric constant of the $Si_3N_4$ films 13 and 16 is approximately 2 to 4. The thicknesses of the films are about 100 nm. The poly-Si layer 14 is sandwiched between the films. This dielectric constant is larger than that of the $SiO_2$ film, whose relative dielectric constant is approximately 2.8. Accordingly, the contribution of the $Si_3N_4$ film of 100 nm thickness to the capacitance corresponds to that of the $SiO_2$ film of about 70 nm thickness. Accordingly, if the poly-Si film 14 is disregarded, two pairs of $Si_3N_4$-$SiO_2$ films have a capacitance corresponding to the $SiO_2$ film having a thickness of 940 nm, that is, approximately $1 \times 10^{-5} pF/\mu m^2$. A single pair of the 100 nm thick $Si_3N_4$ film and the 50 nm thick $SiO_2$ film has a capacitance corresponding to the $SiO_2$ film having a thickness of 120 nm, that is, approximately $9 \times 10^{-5} pF/\mu m^2$. Accordingly, the parasitic capacitance of the present embodiment is one-ninth of that of the prior art device. An electric resistance of the poly-Si layer 14 of FIG. 8 is in the order to 10M $\Omega$-cm but it may be considered that a depletion layer is formed in the poly-Si layer 14 by an electric field applied thereto to reduce the parasitic capacitance.

In the embodiment of FIG. 8, the bottoms 25 of the two shallow grooves reach the surface of the collector buried layer 2. The thickness of the poly-Si layer 14 depends on the thicknesses of the collector buried layer 2 and the Si epitaxial layer 3.

Figure 9:
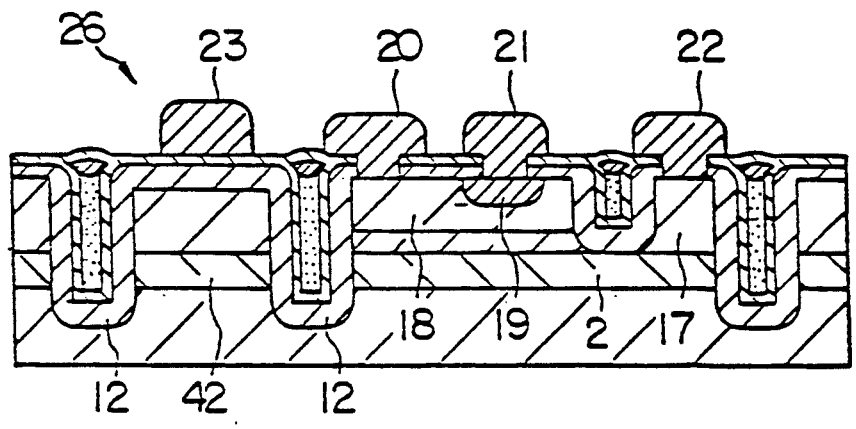
FIGS. 9 to 12 show manufacturing steps of a second embodiment of the present invention.
Figure 10:
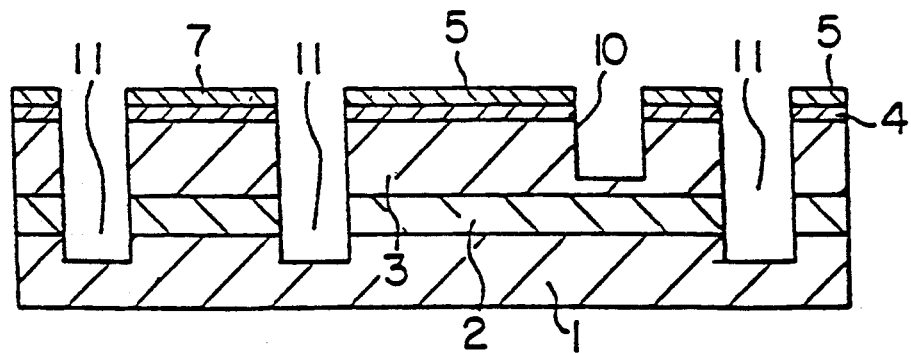
Figure 11:
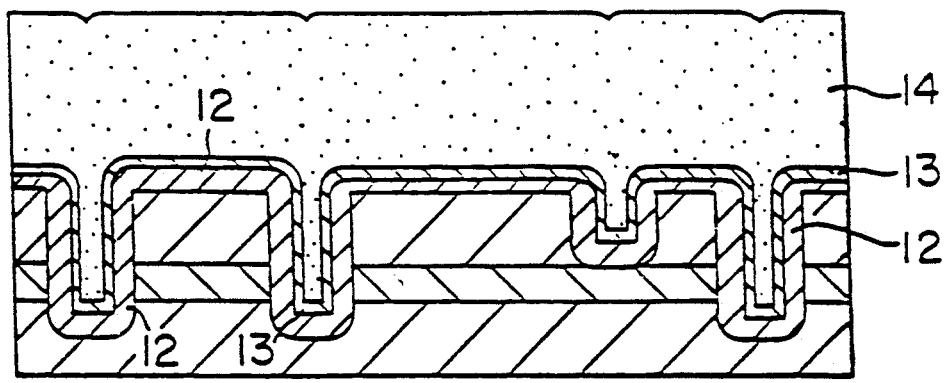
Figure 12:
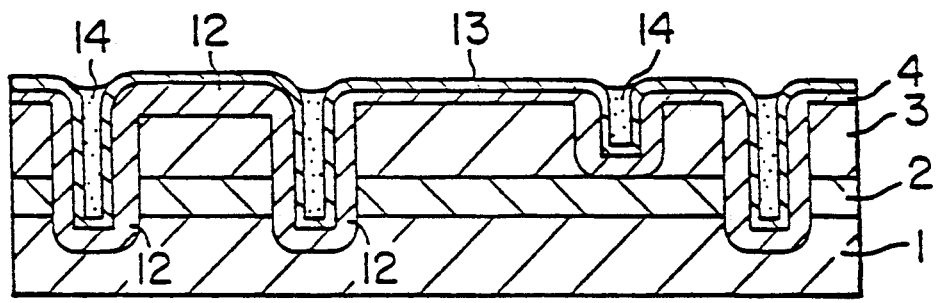

When it is not required that the shallow grooves extend to the collector buried layer, the amount of etching of the Si layer 14 for the shallow grooves in the step of FIG. 4 may be reduced. The etching step of FIG. 4 for forming the shallow grooves may be omitted. The thickness of the poly-Si layer 14 is 0–5.5 $\mu$m. By selecting the depth of the shallow grooves 10 to approximately one-half of the thickness of the SiO$_2$ film 12, the flatness of the surface 26 relative to the other areas is attained by thermal oxidation as shown in FIG. 9. FIGS. 10–12 show manufacturing steps for a second embodiment shown in FIG. 9. They correspond to FIGS. 4–6, respectively. The Si epitaxial layer 3 in the wide isolation region 7 shown in FIG. 10 is not etched. FIGS. 11 and 12 show the same steps as those shown in FIGS. 5 and 6, respectively. The thickness of the SiO$_2$ film 12 shown in FIG. 11 may be slightly larger than the thickness of 400 nm of the SiO$_2$ film shown in FIG. 5, that is, it may be 500–600 nm. As a result, a stray capacitance which is approximately 1/4.5 to 1/5 of that of the 120 nm thick SiO$_2$ film is attained. The collector buried layer 42 shown in FIGS. 8 and 9 is isolated by the deep groove from the other collector buried layer 2.

The device isolations in the first and second embodiments were applied to devices of a bipolar semiconductor integrated circuit and to the peripheries of bonding pads (approximately 100 $\mu$m × 100 $\mu$m) and the underlying areas of the wirings from the bonding pads to the circuit components. A propagation delay time was 0.2 ns/gate. It shows an improvement of 50% over the propagation delay time of 0.3 ns/gate shown in the article of the JJAP.

Figure 13:
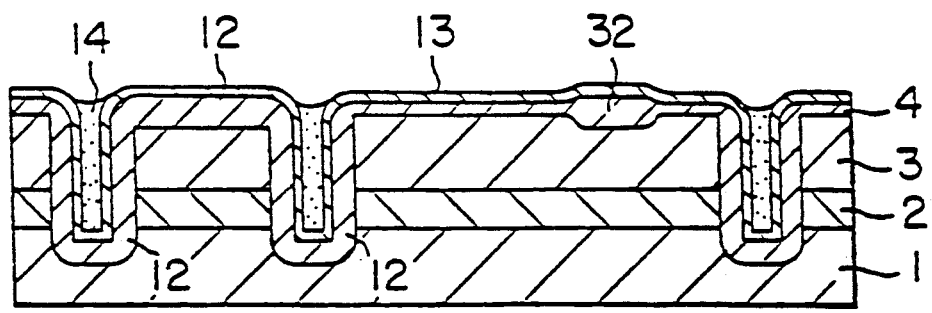
FIGS. 13 and 14 show manufacturing steps of a third embodiment of the present invention.
Figure 14:
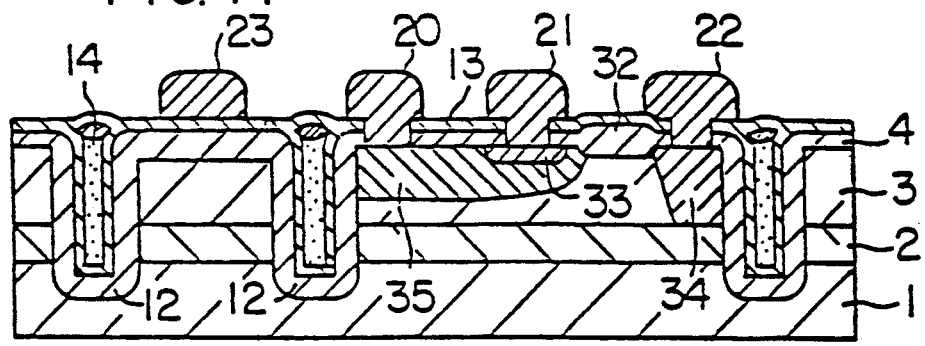

FIGS. 13 and 14 show a third embodiment. The shallow groove 10 shown in FIG. 10 is formed for the interdevice isolation. In FIG. 13, the step of forming the shallow groove 10 is omitted and the interdevice isolation is attained by a SiO$_2$ film 32 having a thickness of 400–600 nm formed by thermal oxidation. FIG. 14 shows a collector diffusion region 34, an emitter diffusion region 33 and a base diffusion region 35 having their diffusion regions delimited by the SiO$_2$ film 32.

Figure 15:
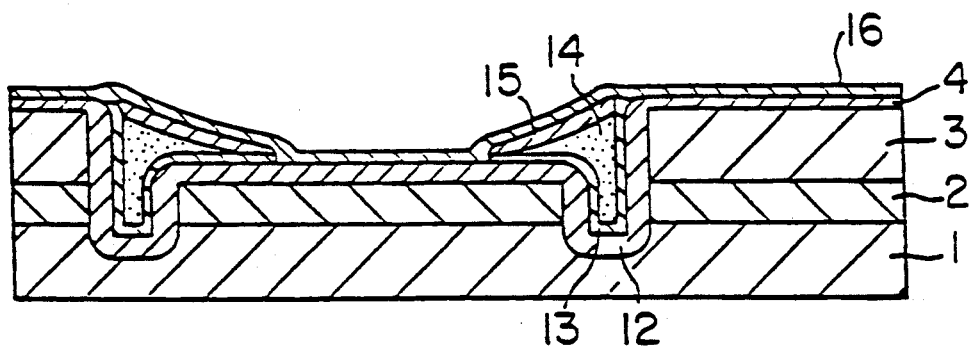
FIGS. 15 to 17 show manufacturing steps of other embodiments of the present invention.

FIG. 15 shows a fourth embodiment in which the width of the interdevice isolation region of the above embodiment is widened to 10 $\mu$m or longer. The surface has no step and has a smooth contour.

Figure 16:
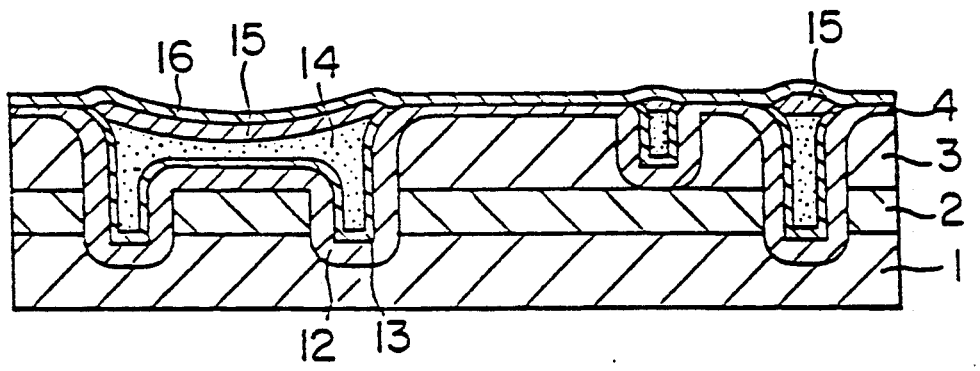

FIG. 16 shows a fifth embodiment.

The cross-sectional shape of the groove is not limited to the U-shape shown in the embodiment but a V-shape or a Y-shape or combination of the three shapes may be used. By over-etching the SiO$_2$ film 4 shown in FIG. 2 and isotropic-etching it by alkaline etchant (KOH or hydrazine) in an early stage of Si etching to form a Y-shaped slope at the top of the deep cylindrical groove to widen the top outward, the flatness of the surface is improved as shown in FIG. 16.

In the above embodiments, the filling material 14 for the isolation grooves is the poly-Si. Alternatively, other insulating material such as SiO$_2$ or Si$_3$N$_4$ may be used. The thickness of the Si$_3$N$_4$ film for masking or passivation is not limited to 100 nm but it may change between 30 nm and 500 nm.

Figure 17:
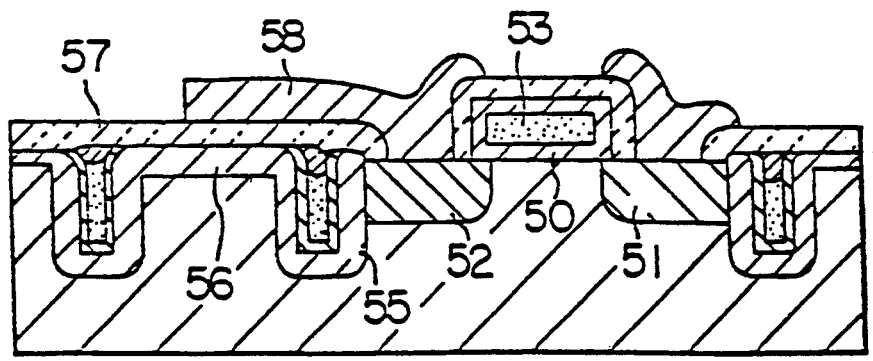

FIG. 17 shows an embodiment of a MOS LSI in accordance with the present invention. A source 51, a drain 52, a poly-Si gate 53 and a thin gate oxidation film 50 under the gate 53 are similar to those of a conventional MOSFET structure. An Al conductive wire 58 is contacted to the drain 52 and extends onto a SiO$_2$ film 56 having a thickness of 200 nm to 1 $\mu$m between two grooves 55 having a depth of approximately 0.3 to 1.0 $\mu$m, and onto a passivation layer 57 (such as PSG).

Noting FIG. 14 as discussed previously, particularly the grooved device-to-device, and oxide layer intradevice, isolation thereof, FIGS. 18 to 33 illustrate an embodiment in which one aspect of the present invention is adapted to a bipolar type of semiconductor integrated circuit device having specific device-to-device and intradevice isolation, with the manufacturing steps shown sequentially.

According to this embodiment, a semiconductor body 124 (note FIG. 18) is first prepared. Holes for the formation of buried layers are formed at suitable positions in a silicon oxide film formed over a semiconductor substrate 101 that consists of p-type monocrystalline silicon. Using the silicon oxide film as a mask, n-type impurities are thermally diffused into the substrate 101 to form a local n$^+$-type buried layer 102. After the silicon oxide film is removed, an n$^-$-type epitaxial layer 103 is grown onto the substrate 101 by a vapor growth method, to provide the semiconductor body 124.

A silicon oxide film (SiO$_2$ film) 104 and a silicon nitride film (Si$_3$N$_4$ film) 105 are formed, utilizing conventional processing steps, on a main surface of the semiconductor body 124.

Figure 18:
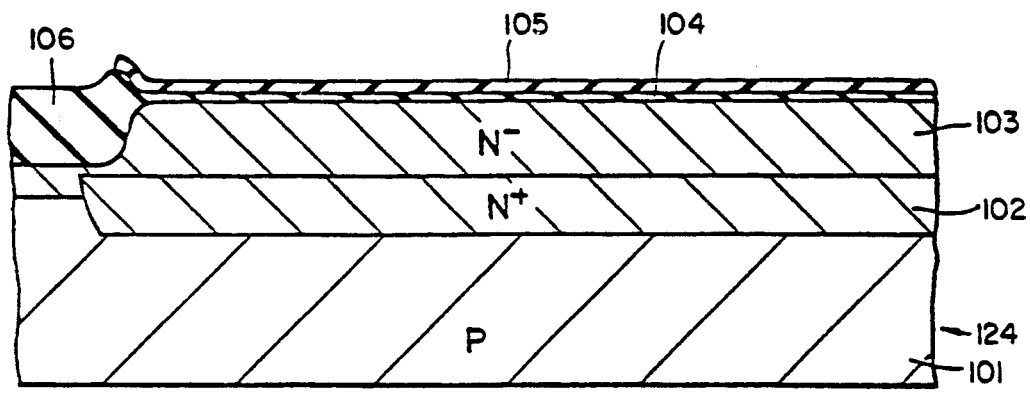
FIGS. 18 to 21, 23 and 25 to 33 are sections showing the steps of manufacturing a bipolar type of semiconductor integrated circuit device.

The silicon nitride film 105 is removed from portions where wiring will be formed around the periphery of the chip. Using the silicon nitride film 105 as a mask, the main surface of the substrate 101 is cut by a conventional isoplanar technique, followed by thermal oxidation, to form a field oxide film of a thickness of between 1 $\mu$m to 1.2 $\mu$m, as shown in FIG. 18. Such field oxide film 106 is formed using conventional processing steps used to form such field oxide films. Since the field oxide film 106 is so thick, it is possible to reduce the electrostatic capacity of the wiring provided in the wiring regions.

The silicon nitride film 105 is removed, and another silicon nitride film 125 made, e.g., by chemical vapor deposition (CVD) is formed over the whole surface of the substrate. An exemplary thickness for such silicon nitride film 125 is 3000 Å.

Figure 19:
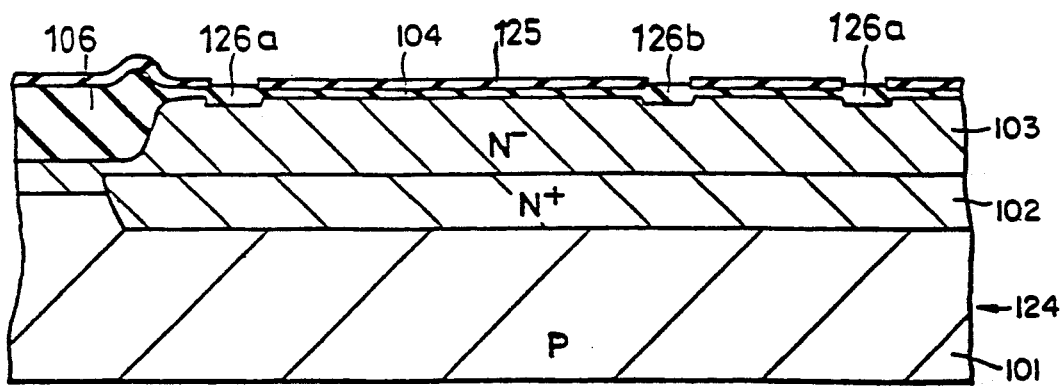

The silicon nitride film 125 is removed by etching (e.g., wet or dry etching) from portions at which isolation regions will be formed, i.e., from the peripheries of bipolar transistors and from regions between the base region and the collector contact region of each transistor. Using the silicon nitride film 125 as a mask, the surface of the semiconductor body 124 is locally oxidized by heating. Silicon oxide films 126a and 126b of a thickness of between 3000 to 3500 Å are then formed over the portions at which the isolation regions will be formed, as shown in FIG. 19. The isolation region, base region, collector contact region, and the isolation region between the base region and the collector contact region are defined by the silicon nitride film 125.

Figure 20:
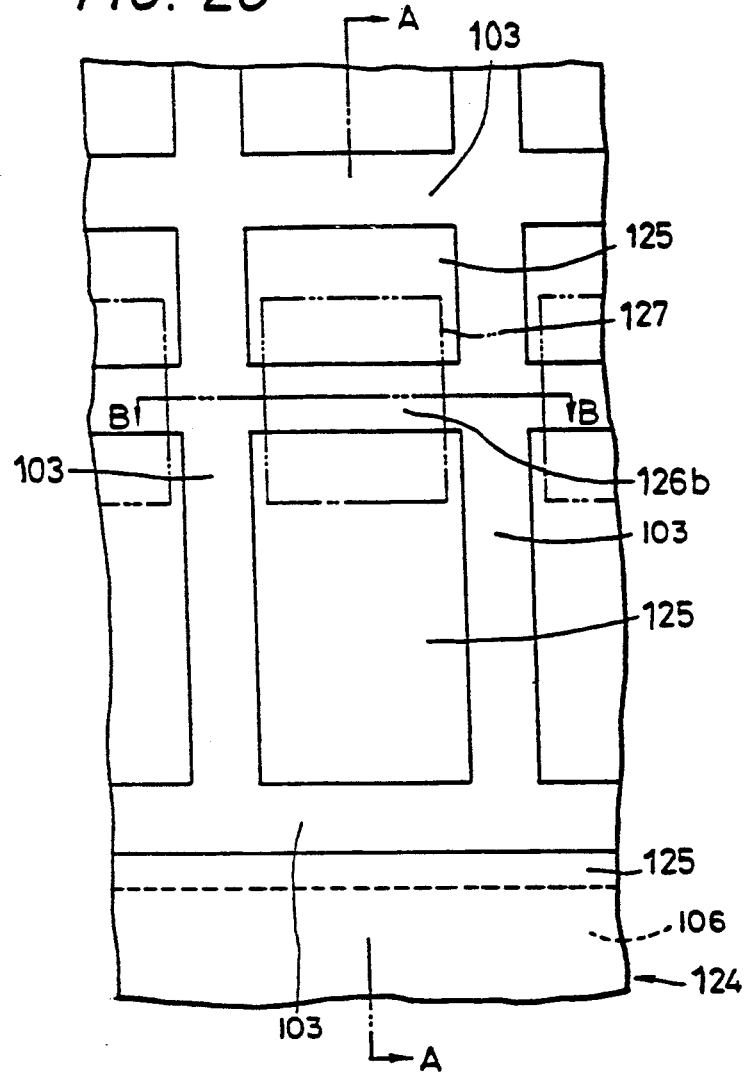
Figure 21:
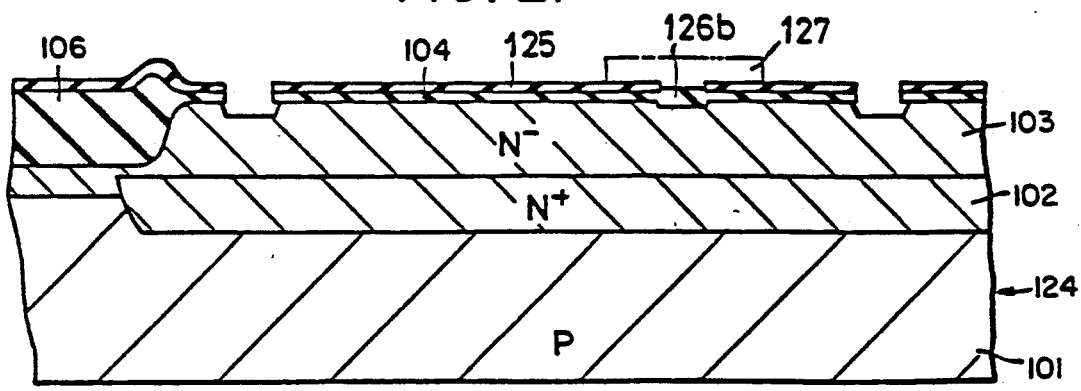
Figure 25:
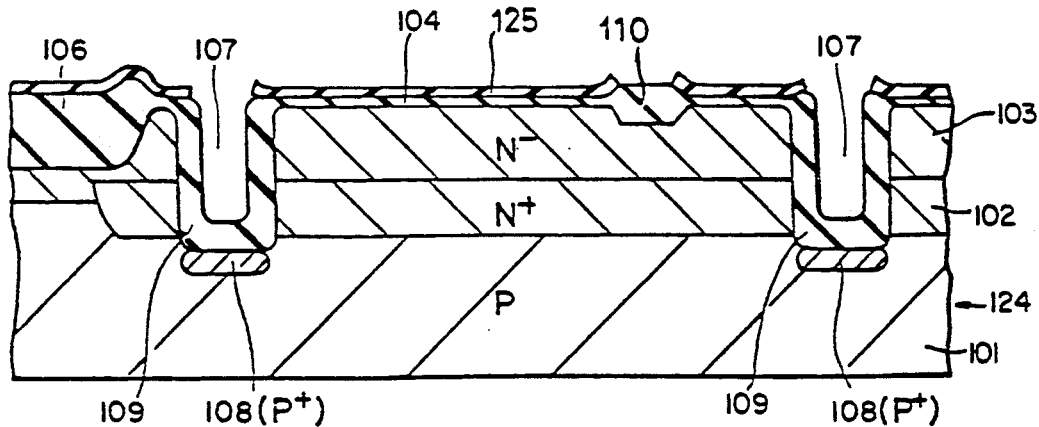

The exposed oxide films 126a are removed by wet etching (using, e.g., conventional techniques), without removing the remaining portions of the silicon nitride film 125, after the region between the base region and the collector contact region is covered with a photoresist film 127. Removal of the exposed oxide films 126a provide grooves having a depth of 500–1000 Å, as an example. The silicon oxide film 126b is left between the base region and the collector contact region, and is used as a mask for the etching of the semiconductor body 124 and for the implantation of ions. After the photoresist film 127 is removed, the openings of the grooves are tapered, as shown in FIGS. 20 and 21, by etching with hydrazine. Such etching with hydrazine provides deepened grooves having a depth of, e.g., 5000–6000 Å, with a taper of 55° from the main surface, for example. The silicon oxide film 126b is not etched by the hydrazine. If the surface of the semiconductor body 124 has been sufficiently tapered after the silicon oxide films 126a have been removed, etching with hydrazine is not necessary. Such tapering is provided to prevent dislocations from being generated in the oxidation process for forming film 109 (FIG. 25).

Figure 22:
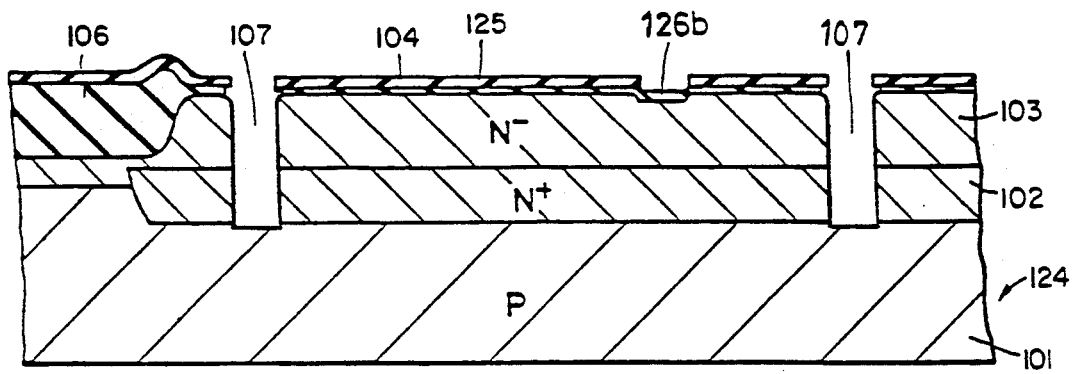
FIG. 22 is a plan view of a bipolar type of semiconductor integrated circuit device during manufacture.

Deep grooves 107 of, e.g., 4 μm depth are formed by dry etching using the silicon nitride film 125 and silicon oxide film 126b as masks so that the grooves reach as far as the substrate 101, as shown in FIG. 22. The etching reduces the thickness of the silicon oxide film 126b of about 2000 Å.

Figure 23:
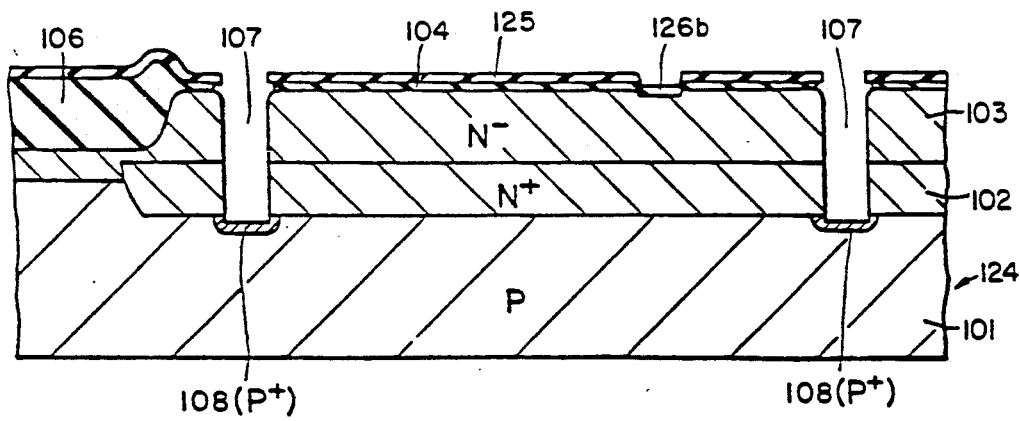

Using the silicon nitride film 125 and silicon oxide film 126b as masks, boron ions are implanted into the bases of the U-grooves 107 (at a dose of $10^{14}$ atoms/cm$^2$, and an energy of 30–40 KeV, for example), and p$^+$-type channel-stopper layers 108 are then formed as shown in FIG. 23 by heat treatment (for example, at 1000° C. for 10 minutes). The boron ions are not introduced into the surface of the semiconductor substrate 124 in the regions where the silicon oxide film 126b has been formed. The breakdown voltage at the pn junction between the base region and the collector region is increased by the introduction of the boron ions. If the silicon oxide film 126b is about 1000 Å thick, it is capable of preventing the boron ions being introduced into the semiconductor body 124.

Using the silicon nitride film 125 as a mask, the surface of the semiconductor body 124 is thermally oxidized, which forms a silicon oxide film 109 of a thickness of about 6000 Å in each U-groove 107. Although not limiting, such film 109 can have a thickness of 4000–8000 Å. Since the nitride film 125 has been removed from the portion between the base region and the collector contact region, a relatively thick isolation oxide film 110 of a thickness of between about 7000 to 8000 Å is formed at this portion. The thickness of the silicon oxide film increases since oxygen reaches the surface of the semiconductor body 124 through the silicon oxide film 126b. The silicon oxide film 110 is thicker than the silicon oxide film 109 by the thickness of the silicon oxide film 126b.

Figure 24:
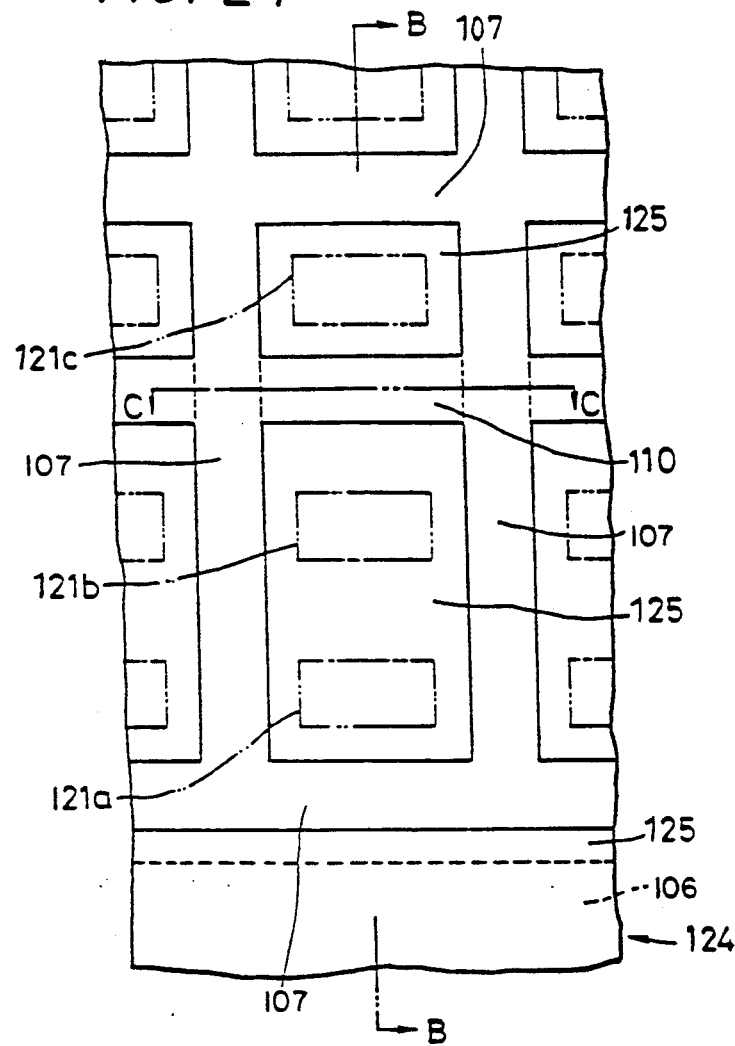
FIG. 24 is a section through the device of FIG. 22.
Figure 26:
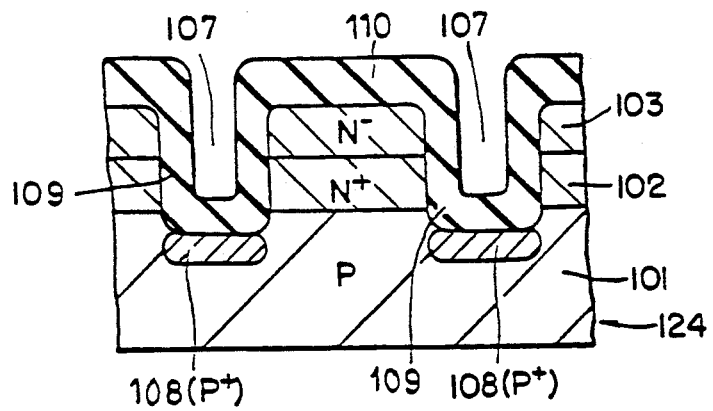

The device in this state is shown in FIGS. 24, 25 and 26, where FIGS. 25 and 26 are sections taken along the lines B—B and C—C of FIG. 24, respectively. In FIG. 24, dot-dash lines 121a, 121b and 121c denote the positions of contact holes that will be formed in a subsequent step.

As shown in FIG. 26, the silicon oxide film 110 has end portions that continue from the silicon oxide film 109, at the same thickness, so that the base region and the collector contact region are reliably isolated from each other. No stress concentration which would generate crystal defects occurs at the boundaries between the U-grooves 107 and the silicon oxide film 110.

Figure 27:
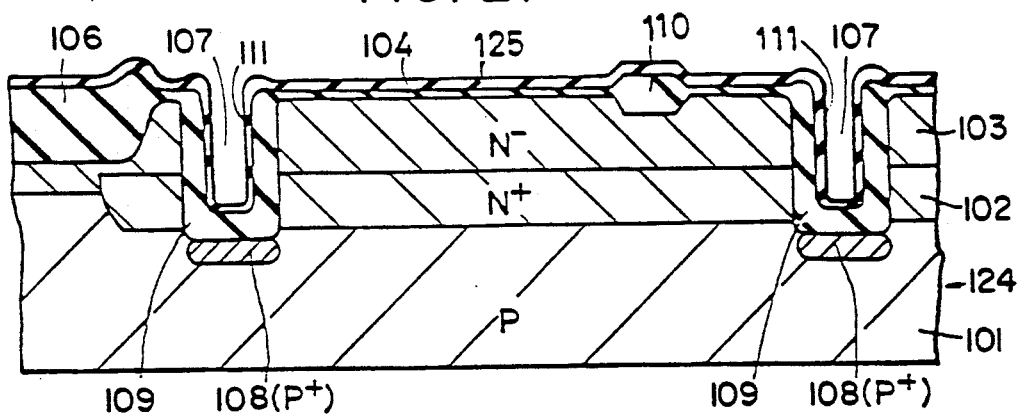

A silicon nitride film is deposited over the whole surface of the semiconductor body 124 by a CVD method or the like so that a silicon nitride film 111 (up to a thickness of, for example, 500 Å) is formed over the oxide film 109 within the U-grooves 107, as shown in FIG. 27.

Figure 28:
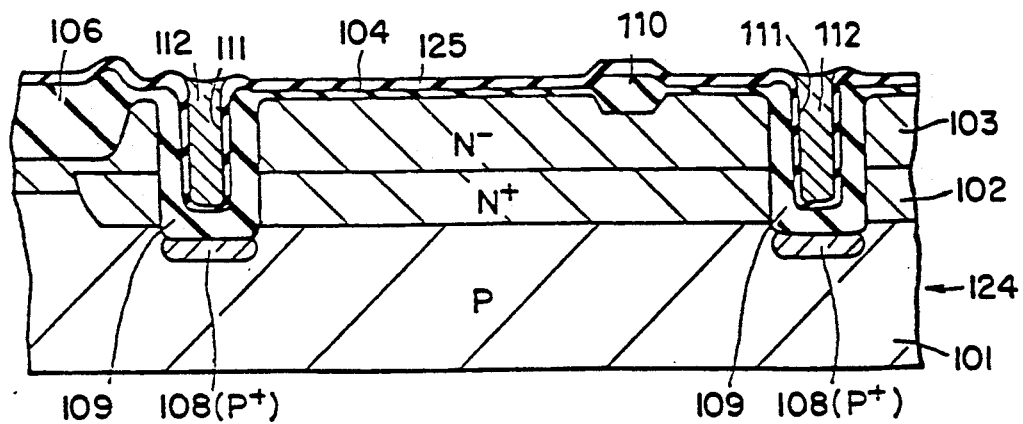

Polycrystalline silicon is deposited thickly over the whole surface of the semiconductor substrate 124 by the CVD method, so that the U-grooves 107 are filled with polycrystalline silicon. The layer of polycrystalline silicon on the surface of the substrate is removed by dry etching to flatten the surface, leaving polycrystalline silicon 112 within the U-grooves 107, as shown in FIG. 28. Materials for filling the U-grooves 107 are not limited to polycrystalline silicon, and can also include, e.g., $SiO_2$.

Figure 29:
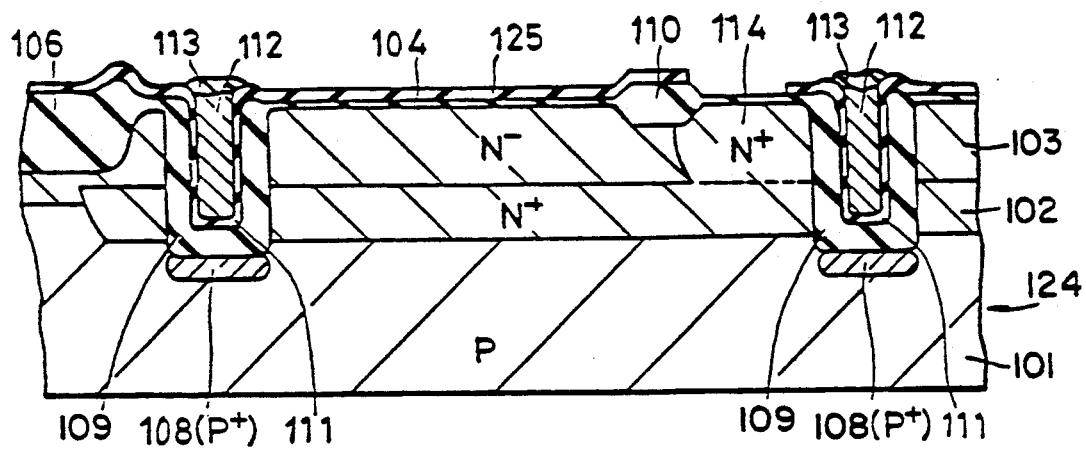

Using the silicon nitride film 125 as a mask, the surface of the polycrystalline silicon 112 in each U-groove is thermally oxidized to form a silicon oxide film 113 to a thickness of 500–6000 Å, e.g., 6000 Å, on top of the polycrystalline silicon 112. Then, as shown in FIG. 29, the silicon nitride film 125 is removed from the collector contact region, using conventional wet or dry etching for removal of silicon nitride films. Using the remaining silicon nitride film 125 as a mask, n-type impurities are implanted and are thermally diffused, as conventionally done, therein to form an n$^+$-type semiconductor region that acts as the collector contact region.

Figure 30:
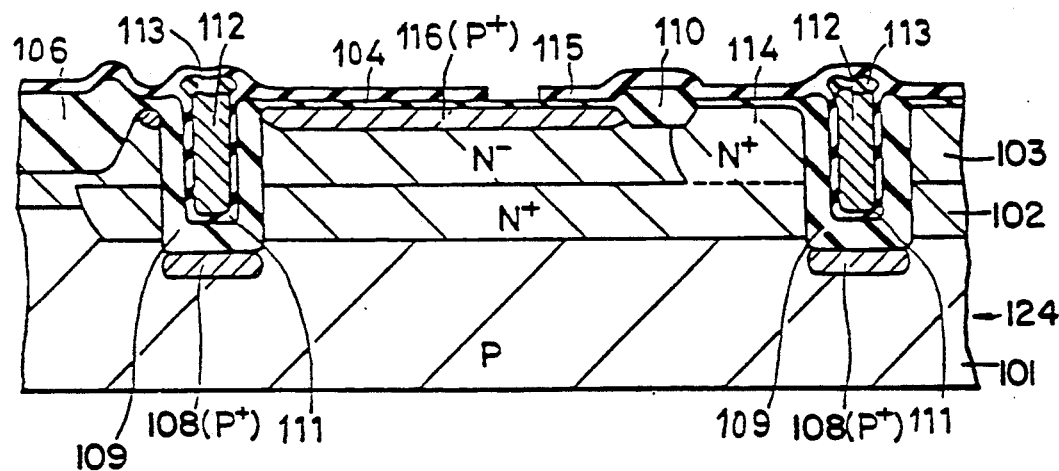

The silicon nitride film 125 is removed using the silicon oxide film 113 as a mask, and p-type impurities are implanted into the whole main surface of the semiconductor body 124 to form a base region, as conventionally done. A new silicon nitride film 115 is formed over the semiconductor body 124, and a p$^+$-type semiconductor region 116 that acts as a base region is formed by a heat treatment. Then, as shown in FIG. 30, the silicon nitride film 115 is removed from the portion that will be the emitter region.

Figure 31:
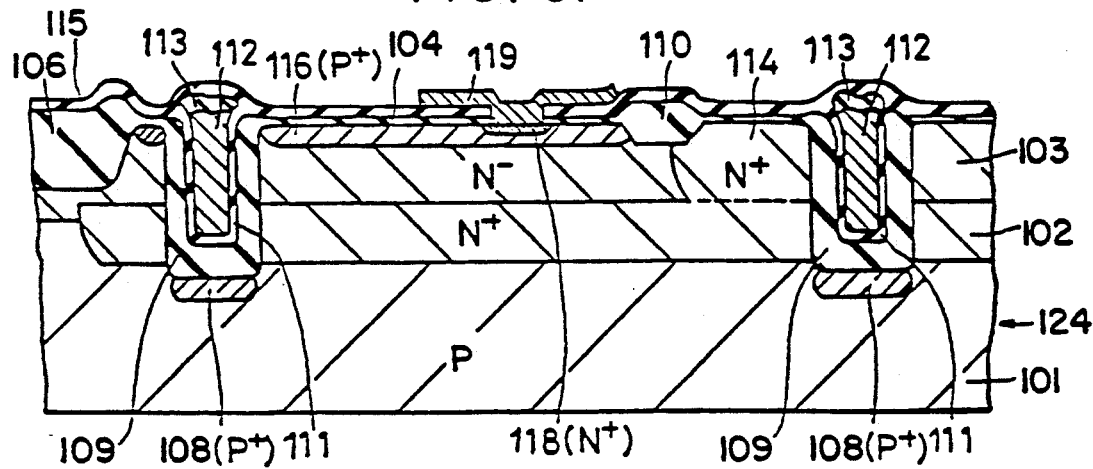

The oxide film 104 is removed by etching from the surface of the portion that will be the emitter region, and polycrystalline silicon is thinly deposited (e.g., a thickness of 2500 Å) by a CVD method over the whole surface of the semiconductor body 124. Using conventional processing techniques, n-type impurities such as arsenic ions are implanted into the polycrystalline silicon layer, and are then diffused from the polycrystalline silicon layer by a heat treatment to form an n$^+$-type semiconductor region 118 that acts as the emitter region. A polycrystalline silicon electrode 119 is left on the emitter region 118 by a photolithographic technique, as shown in FIG. 31.

In this device, the emitter region 118 is formed by the diffusion of ions from the polycrystalline silicon layer. It is, however, also possible to implant ions and effect a heat treatment to form the emitter region prior to the depositing of the polycrystalline silicon. Furthermore, the emitter region can be formed by implanting and diffusing ions, and by making the ions diffuse from polycrystalline silicon, before depositing the polycrystalline silicon electrode.

Figure 32:
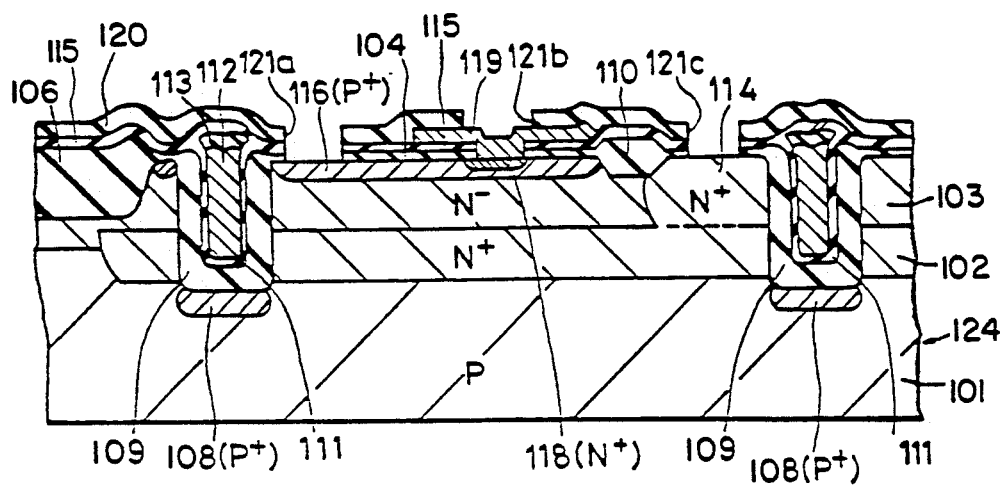

A PSG film (phosphosilicate glass film) is formed by a CVD method over the semiconductor body 124, to form an intermediate insulating film 120. Using a photoresist film as a mask, contact holes 121a to 121c are formed by etching, as shown in FIG. 32, to form the contact holes to the base region, emitter contact and collector region.

A wiring material such as aluminum is vaporized onto the whole surface of the semiconductor body 124, and aluminum electrodes 122a to 122c as well as aluminum wiring are formed by a photolithographic technique. A final passivation film 123 such as an SiO₂ film is then formed, as shown in FIG. 33.

Figure 33:
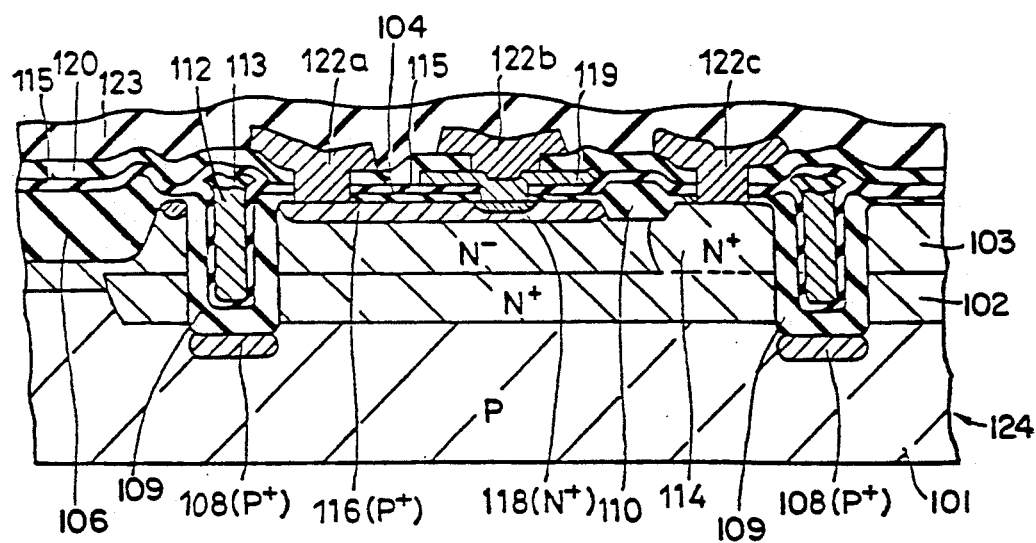

FIG. 33 shows only one bipolar transistor with an epitaxial layer 103 to its right instead of other transistors. This is also true for FIGS. 29 to 32.

In this embodiment, the isolation oxide film 110 (that is, intradevice isolation) is formed between the collector contact region 114 and the base region 116, simultaneously with the formation of the silicon oxide film 109 in each U-groove isolation region. Therefore, no separate step is required for the formation of the isolation oxide film 110. Furthermore, when each collector region 114 and base region 116 are isolated from each other by a shallow U-groove, it is necessary to cut the U-grooves using two steps. According to this embodiment, however, the U-grooves 107 can be formed by a single step, simplifying the process.

The isolation oxide film 110 is formed simultaneously with the formation of the silicon oxide film 109, so that the isolation oxide film 110 is formed nearly uniformly from the central portion to the edge portions thereof, as shown in FIG. 26. On the other hand, when the silicon oxide film 109 and the isolation oxide film 110 are formed by separate steps, the boundaries between both edges of the oxide film 110 and the U-groove isolation region 107 become so thin that the breakdown voltage at the junction between the base region and the collector region drops. According to the present embodiment of the present invention, on the other hand, the breakdown voltage does not decrease but is kept sufficiently high.

It is easier to control the thickness of the oxide film 110 than the depth of the U-shape isolation regions, so that variations in the electrical characteristics of the transistors can be reduced. The method in which the collector contact region 114 is isolated by a U-groove isolation region from the base region 116 has the disadvantage that, as the U-groove reaches the buried layer 103 through the epitaxial layer 102, the collector resistance increases. When the U-groove is shallow, on the other hand, the breakdown voltage at the junction between the base region and the collector region drops. According to this embodiment, however, the electrical characteristics of the transistors are greatly improved.

In this embodiment, the thick field oxide film 106 is formed over the regions where there are not transistors. A wiring layer, for instance, can be formed over the thick field oxide film 106, so that the regions covered by the field oxide film 106 is formed can be used as wiring channels.

The emitter region 118 can be formed by implanting n-type impurities into the main surface of the substrate, without forming the polycrystalline silicon electrode 119, and the collector contact region can be formed after the base region and the emitter region have been formed.

The field oxide film 106 for the wiring region may be formed simultaneously with the formation of the silicon oxide film 109 in the U-groove, in the same way as the formation of the isolation oxide film 110.

An isolation oxide film (an insulating material providing isolation) is formed between the collector contact region and the base region simultaneously with the formation of an oxide film (insulating material) in the U-grooves used for isolation. Therefore, the isolation oxide film (the insulating material providing isolation) between the collector contact region and the base region has a nearly uniform thickness from the central portion to the edge portions, so that the base region and the collector region are completely isolated from each other, and the thickness of the isolation oxide film (the insulating material providing isolation) does not vary much, and consequently, the transistors exhibit an improved performance. Moreover, there is no need for providing a separate step of forming an isolation oxide film between the collector contact region and the base region, and the process can thus be simplified.

The present invention accomplished by the inventors has been described in the foregoing by way of a specific embodiment. However, the invention should in no way be limited to this embodiment alone, but can be modified in various ways within a range that does not depart from the gist of the invention.

For instance, the field oxide film provided over the wiring region in this embodiment need not be limited to one that is formed by the isoplanar technique. The field oxide film can be obtained by selective oxidation, without subjecting the surface of the semiconductor substrate to etching. A p⁺-type buried layer can be formed just under the field insulation film, or the field insulation film need not be formed at all.

The foregoing description has dealt with the case in which this aspect of the present invention was adapted to a bipolar type semiconductor integrated circuit, which was used as a background for the invention. This aspect of the present invention, however, should not be limited to this embodiment alone, but can be utilized for any semiconductor device that requires isolation regions on the main surface of a semiconductor substrate. For example, the present invention can also be used for forming MOS devices, particularly CMOS devices. For example, the trench can be utilized to isolate P(N)-well (substrate) and N(P)-well (substrate), and film 110 can be used to isolate each MOSFET. Also, the present invention can be applied to devices provided with both MOSFETs and a bipolar transistor.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A process of manufacturing a semiconductor integrated circuit device, comprising the steps of:
    (a) grooving a Si substrate at a portion to be used as an inactive wiring region of said integrated circuit device to form a pair of grooves;
    (b) forming a first insulating film on inner surfaces of said pair of isolation grooves and a field oxide film for isolation on a surface between said pair of isolation grooves on said Si substrate simultaneously, the field oxide film dividing the surface between the pair of isolation grooves into first and second sub-regions; and
    (c) forming wirings over said first insulating film so that said first insulating film and said isolation grooves minimize parasitic capacitance between said wirings and said subtrate.

2. A process of manufacturing a semiconductor integrated circuit device according to claim 1, further comprising the steps of:

forming a poly-Si layer on said first insulting layer by desposition of Si; and forming second and third insulating films on said poly-Si layer.

3. A process of manufacturing a semiconductor integrated circuit device according to claim 2, said first insulating film forming step comprising substeps of forming a silicon dioxide film and a silicon nitride film.

4. A process of manufacturing a semiconductor integrated circuit device according to claim 3, said silicon dioxide film forming substep including thermal oxidation of a surface of said Si substrate and said silicon nitride film forming substep including chemical vapor deposition of silicon nitride.

5. A process of manufacturing a semiconductor integrated circuit device according to claim 4, wherein said second insulating film is made of silicon dioxide, said second silicon dioxide film made by thermally oxidizing a surface of said poly-Si layer, said third insulating film is made of silicon nitride and the thickness of said second silicon dioxide film is larger than that of said first silicon dioxide film.

6. A processing of manufacturing a semiconductor integrated circuit device, comprising the steps of:

(a) forming grooves in one main surface of a semiconductor body by etching a surface of the semiconductor body, the grooves dividing the main surface of the semiconductor body into a plurality of regions;

(b) forming a first isolation oxide film and a second isolation oxide film, the first isolation oxide film being formed over the surface of the semiconductor body exposed in the grooves, and the second isolation oxide film being formed on a part of the surface of each of the plurality of regions, the second isolation oxide film dividing the surface of each of the plurality of regions into first and second sub-regions;

(c) introducing impurities of a first conductivity type into one of the first and second sub-regions, to form a first semiconductor region of a first conductivity type in said one of the first and second sub-regions; and (d) introducing impurities of a second conductivity type into the other of the first and the second sub-regions to form a second semiconductor region of the second conductivity type in the other of the first and second sub-regions, the second conductivity type being of a conductivity type opposite to that of the first conductivity type, whereby said second isolation oxide film constitutes an isolation oxide film between the first semiconductor region of first conductivity type and the second semiconductor region of second conductivity type.

7. A process of manufacturing a semiconductor integrated curcuit device according to claim 6, wherein the first and second isolation oxide films are first and second silicon oxide films.

8. A process of manufacturing a semiconductor integrated circuit device according to claim 7, wherein the semiconductor body is formed of silicon, and the first and second silicon oxide films are formed by thermal oxidation of the silicon semiconductor body.

9. A process of manufacturing a semiconductor integrated curcuit device according to claim 6, wherein the first and second isolation oxide films are formed simultaneously.

10. A process of manufacturing a semiconductor intergrated circuit device according to claim 9, wherein said second isolation oxide film is formed by thermal oxidation of the subtrate.

11. A process of manufacturing a semiconductor integrated circuit device according to claim 10, wherein a plurality of bipolar transisters are formed in the plurality of regions, with a bipolar transistor being formed in a respective one of the plurality of regions, and wherein said first semiconductor region of the first conductivity type and said second semiconductor region of the second conductivity type constitute a base region and a collector contact region, respectively, of the bipolar transistor formed in the respective one of the plurality of regions.

12. A process of manufacturing a semiconductor integrated circuit device according to claim 11, wherein said grooves are deep grooves serving to isolate each of the bipolar transistors in a respective one of the plurality of regions.

13. A process of manufacturing a semiconductor integrated circuit device according to claim 12, wherein the second isolation oxide film has end portions that continue from the first isolation oxide film, at the same thickness as the first isolation oxide film.

14. A process of manufacturing a semiconductor integrated circuit device according to claim 12, wherein the second isolation oxide film is substantially uniform in thickness.

15. A process of manufacturing a semiconductor integrated circuit device according to claim 6, wherein the second isolation oxide film has end positions that continue from the first isolation film, at the same thickness as the first isolation film.

16. A process of manufacturing a semiconductor intergrated circuit device according to claim 6, wherein the second isolation oxide film is substantially uniform in thickness.

17. A process of manufacturing a semiconductor integated circuit device according to claim 6, comprising thr further step of forming a field oxide region on the semiconductor body, and wherein the field oxide region is formed simultaneously with forming the first and second oxide films.

18. A process of manufacturing a semiconductor integrated circuit device according to claim 6, further comprising the steps of filling the grooves, having the first isolation film thereon, with polycrystalline silicon, and then forming a silicon oxide film on said polycrystalline silicon so as to form an isolation structure.

19. A process of manufacturing a semiconductor intergrated circuit device according to claim 6, further comprising the step of forming channel stopper layers in the bases of the grooves by introducing impurities of the first conductivity type into the bases of the grooves.

20. A process of manufacturing a semiconductor integrated circuit device according to claim 6, wherein said semiconductor body is comprised of a base substrate of the first conductivity type, a buried layer of the second conductivity type on said base substrate, and an epitaxial layer of said second conductivity type on said buried layer, and wherein the grooves extend from said one main surface of said semiconductor body into said base substrate through said epitaxial and buried layers.

21. A process of manufacturing a semiconductor integrated circuit device according to claim 6, wherein the step of forming grooves includes forming first and second sub-grooves in the semiconductor body, the first and second sub-grooves being spaced from each other, and forming a single insulating film over the surfaces of the first and second sub-grooves and to cover an area of the semiconductor body between the first and second sub-grooves, and wherein the process comprises the further step of forming wirings for the integrated circuit device over the single insulating film formed to cover said area between the first and second sub-grooves, the single insulating film acting to separate the wirings from the semiconductor body so as to minimize parasitic capacitance between the wirings and the semiconductor body.

22. A process of manufacuring a semiconductor integrated circuit device according to claim 21, wherein said single film is formed to extend continuously over the surfaces of the first and second sub-grooves and to cover said area between the first and second sub-grooves.

23. A process of manufacturing a semiconductor integrated circuit device, comprising steps of:
(a) forming a semiconductor body which comprises a semiconductor substrate of a first conductivity type, a buried layer of a second conductivity type, opposite to said first conductivity type, on said substrate, and an epitaxial layer of said second conductivity type on said buried layer;
(b) forming grooves in one main surface of said semiconductor body by etching said semiconductor body, said grooves reaching as far as said semiconductor substrate from said one main surface of said semiconductor body, and dividing said buried layer and said epitaxial layer into a plurality of regions;
(c) simultaneously forming a first silicon oxide film and a second silicon oxide film as a unitary structure, said first silicon oxide film being formed over the surface of said semiconductor body exposed within said grooves, and said second silicon oxide film being formed on a part of the surface of each of the plurality of regions, the surface of each of said epitaxial layers in each of the plurality of regions being divided into a first region and a second region by said second silicon oxide film;
(d) forming isolation regions using said grooves, each of said isolation regions isolating said plurality of regions divided by said grooves from each other; and (e) forming bipolar transistors in said isolated plurality of regions, each of said bipolar transistors comprising a base region of said first conductivity type formed in a first position of said epitaxial layer, an emitter region of said second conductivity type formed in a portion of said region, and a collector region that is comprised of said buried layer, a second poriton of said epitaxial layer and a collector contact region of said second conductivity type formed in a further position of said epitaxial layer; wherein said collector contact region is formed in said first region of said epitaxial layer, and said base region is formed in said second region of said epitaxial layer, whereby said second silicon oxide film isolates said collector contact region from said base region, and the isolation regions formed using said grooves isolate the bipolar transistors from each other.

24. A process of manufacturing a semiconductor integrated circuit device according to claim 23, wherein the second silicon oxide film forms a part of the oxide film isolating the collector contact region from the base region, and the oxide film isolating the collector region from the base region has a substantially unifrom thickness.

25. A process of manufacturing a semiconductor integrated circuit device according to claim 23, wherein the second silicon oxide film forms a part of the oxide film isolating the collector region from the base region, and the oxide film isolating the collector contact region from the base region has end portions that continue from the first silicon oxide film, at the same thickness as the first silicon oxide film.

26. A process of manufacturing a semiconductor integrated circuit device according to claim 23, wherein said first and second silicon oxide films are formed by selectively thermally oxidizing said semiconductor body.

27. A process of manufacturing a semiconductor integrated circuit device according to claim 26, wherein said isolation regions are formed by filling said groves with polycrystalline silicon and by covering the surface of said polycrystalline silicon with a silicon oxide film.

28. A process of manufacturing a semiconductor integrated circuit device according to claim 26, wherein said first and second silicon oxide films have substantially the same thickness.

29. A process of manufacturing a semiconductor integrated circuit device according to claim 23, wherein said process further comprises:
(h) forming a semiconductor region of said first conductivity type in said semiconductor body in the bottoms of said grooves, said semiconductor region having an impurity concnetration higher than that of said semiconductor substrate, and said impurities are introduced into said semicomductor body by ion implantation using said first and second masks, while said second mask is still in place, after the step (b) of forming the grooves has been effected.

30. A process of manufacturing a semiconductor integrated circuit device according to claim 23, comprising a further step of forming a field oxide film on the surface of the semiconductor body.

31. A process of manufacturing a semiconductor integrated circuit device according to claim 30, wherein said field oxide film and said first and second silicon oxide layers are formed simultaneously.

32. A process of manufacturing a semiconductor integrated circuit device according to claim 23, wherein said process further comprises:
(f) forming a first mask on one main surface of said semiconductor body, except for the regions at which said grooves will be formed and the regions where said second silicon oxide film will be formed; and
(g) forming a second mask on the regions where said second silicon oxide film will be formed; wherein said grooves are thereafter formed by etching said semiconductor body using said first and second masks, and said first and second silicon oxide films are formed using said first mask.

33. A process of manufacturing a semiconductor integrated circuit device according to claim 32, wherein said first mask consists of a silicon nitride film, and said first and second silicon oxide films are formed by selectively and thermally oxidizing said semiconductor body.

34. A process of manufacturing a semioconductor integrated circuit device according to claim 32, wherein said second mask consists of a silicon oxide film that is formed by selectively thermally oxidizing said semiconductor body using said first mask.

35. A process of manufacturing a semiconductor integrated circuit device according to claim 34, wherein a silicon oxide film is formed over the regions where said grooves will be formed simultaneously with the formation of said second mask, and said silicon oxide film is removed in said step (g).

36. A process of manufacturing a semiconductor integrated circuit device according to claim 34, wherein after the step (b) of forming the grooves has been effected, said first and second silicon oxide films are formed by thermally oxidizing said semiconductor substrate using said first mask while said second mask is still in place, said second silicon oxide film being thicker than first silicon oxide film.

37. A process for manufacturing a semiconductor integrated circuit, comprising:
  (a) forming a semiconductor body having a substrate of a first conductivity type, a buried layer of a second conductivity type, opposite to said first conductivity type, on said substrate, and an epitaxial layer of the second conductivity type on said buried layer;
  (b) forming a first silicon oxide film on the body, the first silicon oxide film having a first part and a second part, the first part having a greater thickness than the second part;
  (c) forming grooves in the semiconductor body, said grooves extending through the first silicon oxide film, the epitaxial layer and the buried layer to the substrate, thereby to divide the epitaxial and buried layers into a plurality of isolated regions;
  (d) simultaneously forming further silicon oxide films on the surface of the semiconductor body, the further silicon oxide films including a first further film within the grooves and a second further film in the second part of the first silicon oxide film and being of greater thickness than the second part of the first silicon oxide film on at least a part of the surface of at least one isolated region, such that the surface of the epitaxial layer of each isolated region is divided into a first sub-part and a second sub-part by the second further film;
  (e) forming isolation materails in the grooves; and (f) forming bipolar transistors in at least some of the isolated regions, each of said bipolar transistors including a base region of the first conductivity type in the first sub-part of the epitaxial layer and a collector contact region of the second conductivity type in the second sub-part of the epitaxial layer.

* * * * *